United States Patent
Arflack et al.

(10) Patent No.: US 9,167,719 B2
(45) Date of Patent: Oct. 20, 2015

(54) SYSTEMS AND METHODS FOR MANAGING HEAT GENERATED BY ELECTRONIC EQUIPMENT IN AN ELECTRONIC EQUIPMENT ENCLOSURE

(71) Applicant: Panduit Corp., Tinley Park, IL (US)

(72) Inventors: Brian K. Arflack, Burr Ridge, IL (US); Samuel J. Adducci, Palos Heights, IL (US)

(73) Assignee: Panduit Corp., Tinley Park, IL (US)

( * ) Notice: Subject to any disclaimer, the term of this patent is extended or adjusted under 35 U.S.C. 154(b) by 314 days.

(21) Appl. No.: 14/017,924

(22) Filed: Sep. 4, 2013

(65) Prior Publication Data

US 2014/0043758 A1 Feb. 13, 2014

Related U.S. Application Data

(63) Continuation of application No. 13/170,588, filed on Jun. 28, 2011, now Pat. No. 8,559,176.

(60) Provisional application No. 61/365,620, filed on Jul. 19, 2010.

(51) Int. Cl.
*H05K 7/20* (2006.01)
*H05K 7/14* (2006.01)

(52) U.S. Cl.
CPC .......... *H05K 7/20009* (2013.01); *H05K 7/1489* (2013.01); *H05K 7/20736* (2013.01)

(58) Field of Classification Search
CPC .......... H05K 7/20718–7/20627; H05K 7/1489
See application file for complete search history.

(56) References Cited

U.S. PATENT DOCUMENTS

| | | | |
|---|---|---|---|
| 3,654,379 A | | 4/1972 | Rodgers |
| 4,442,475 A | * | 4/1984 | Franklin ............ H05K 7/20563 165/80.3 |
| 4,515,419 A | | 5/1985 | Hampel et al. |
| 4,572,240 A | | 2/1986 | Van Becelaere |
| 4,593,493 A | | 6/1986 | Naka et al. |
| 5,040,162 A | | 8/1991 | De Rozarieux et al. |
| 5,424,916 A | * | 6/1995 | Martin ............ H05K 7/20636 165/80.4 |
| 5,626,406 A | | 5/1997 | Schmid |
| 5,924,782 A | | 7/1999 | Park |
| D473,543 S | | 4/2003 | Powell et al. |

(Continued)

FOREIGN PATENT DOCUMENTS

WO 8502516 A1 6/1985

OTHER PUBLICATIONS

Opengate's SwitchAir 1U Network Switch Cooling® product brochure, 2 pages, Aug. 2010.

(Continued)

*Primary Examiner* — Gregory Thompson
(74) *Attorney, Agent, or Firm* — Christopher S. Clancy; James H. Williams

(57) ABSTRACT

A system for managing heat generated by electronic equipment in an electronic equipment enclosure is provided. The system includes a duct adapted to receive a first portion of the electronic equipment. The first portion of the electronic equipment includes an air intake opening. The duct forms a barrier between the first portion of the electronic equipment and a second portion of the electronic equipment. The second portion of the electronic equipment includes an air exhaust opening. The barrier separates cooled air entering the air intake opening and heated air exiting the air exhaust opening.

14 Claims, 14 Drawing Sheets

(56) References Cited

U.S. PATENT DOCUMENTS

| | | |
|---|---|---|
| 6,590,768 B1 | 7/2003 | Wiley |
| 6,678,156 B2 | 1/2004 | Moizer |
| 6,909,603 B2 | 6/2005 | Wiley |
| 7,324,336 B2 * | 1/2008 | Vos .................. H05K 7/20563 165/104.33 |
| 7,434,412 B1 | 10/2008 | Miyahira |
| 7,595,985 B2 | 9/2009 | Adducci et al. |
| 7,604,535 B2 | 10/2009 | Germagian et al. |
| 2002/0101721 A1 | 8/2002 | Blood |
| 2006/0193114 A1 * | 8/2006 | Faneuf ............... H05K 7/20809 361/689 |
| 2007/0171610 A1 | 7/2007 | Lewis |
| 2007/0173189 A1 | 7/2007 | Lewis |
| 2007/0256363 A1 | 11/2007 | Hord et al. |
| 2008/0266789 A1 | 10/2008 | Hruby et al. |
| 2009/0122484 A1 | 5/2009 | Caveney |
| 2010/0003911 A1 | 1/2010 | Graczyk et al. |
| 2010/0238626 A1 | 9/2010 | Linhares, Jr. et al. |

OTHER PUBLICATIONS

Opengate's SwitchAir 2U Network Switch Cooling® product brochure, 2 pages, Aug. 2011.

* cited by examiner

SYSTEMS AND METHODS FOR MANAGING HEAT GENERATED BY ELECTRONIC EQUIPMENT IN AN ELECTRONIC EQUIPMENT ENCLOSURE

CROSS-REFERENCE TO RELATED APPLICATIONS

This application is a continuation of U.S. patent application Ser. No. 13/170,588, filed on Jun. 28, 2011, which claims the benefit of U.S. Provisional Patent Application No. 61/365,620, filed on Jul. 19, 2010, each of which is incorporated by reference in its entirety.

BACKGROUND OF THE INVENTION

The present invention relates to systems and methods for managing heat generated by electronic equipment, such as a switch, in an electronic equipment enclosure, such as a network cabinet. More particularly, the present invention relates to systems and methods for managing heat generated by electronic equipment in an electronic equipment enclosure that separate heated air exiting the electronic equipment from cooled air entering the electronic equipment and that accommodate a variety of electronic equipment and electronic equipment enclosures.

Typically, electronic equipment generates heat. In order to dissipate the heat, cooled air is provided to the electronic equipment. The cooled air enters the electronic equipment and the heat, in the form of heated air, exits the electronic equipment. However, when the electronic equipment is enclosed, for example, in an electronic equipment enclosure, it is possible for the heated air to mix with the cooled air, elevating its temperature, and thereby, reducing its effectiveness, potentially damaging the electronic equipment or increasing the cost of operating it without the risk of damage. Therefore, there is a need for systems and methods for managing heat generated by electronic equipment in an electronic equipment enclosure that separate heated air exiting the electronic equipment from cooled air entering the electronic equipment.

Additionally, a variety of electronic equipment and electronic equipment enclosures are available. Therefore, there is a need for systems and methods for managing heat generated by electronic equipment in an electronic equipment enclosure that accommodate a variety of electronic equipment and electronic equipment enclosures.

SUMMARY OF THE INVENTION

A system for managing heat generated by electronic equipment in an electronic equipment enclosure is provided. The system includes a duct adapted to receive a first portion of the electronic equipment. The first portion of the electronic equipment includes an air intake opening. The duct forms a barrier between the first portion of the electronic equipment and a second portion of the electronic equipment. The second portion of the electronic equipment includes an air exhaust opening. The barrier separates cooled air entering the air intake opening and heated air exiting the air exhaust opening.

DETAILED DESCRIPTION

FIGS. 1-14 illustrate a thermal management system 100 for a switch 200, such as a Cisco Nexus 2000 Series Fabric Extender (e.g., a Cisco Nexus 2148T Fabric Extender, a Cisco Nexus 2248TP GE Fabric Extender, or a Cisco Nexus 2232PP 10GE Fabric Extender), mounted in a network cabinet 300, such as a Panduit Net-Access™ Cabinet or a Panduit Net-Serv™ Cabinet, according to an embodiment of the present invention.

Figure 1:
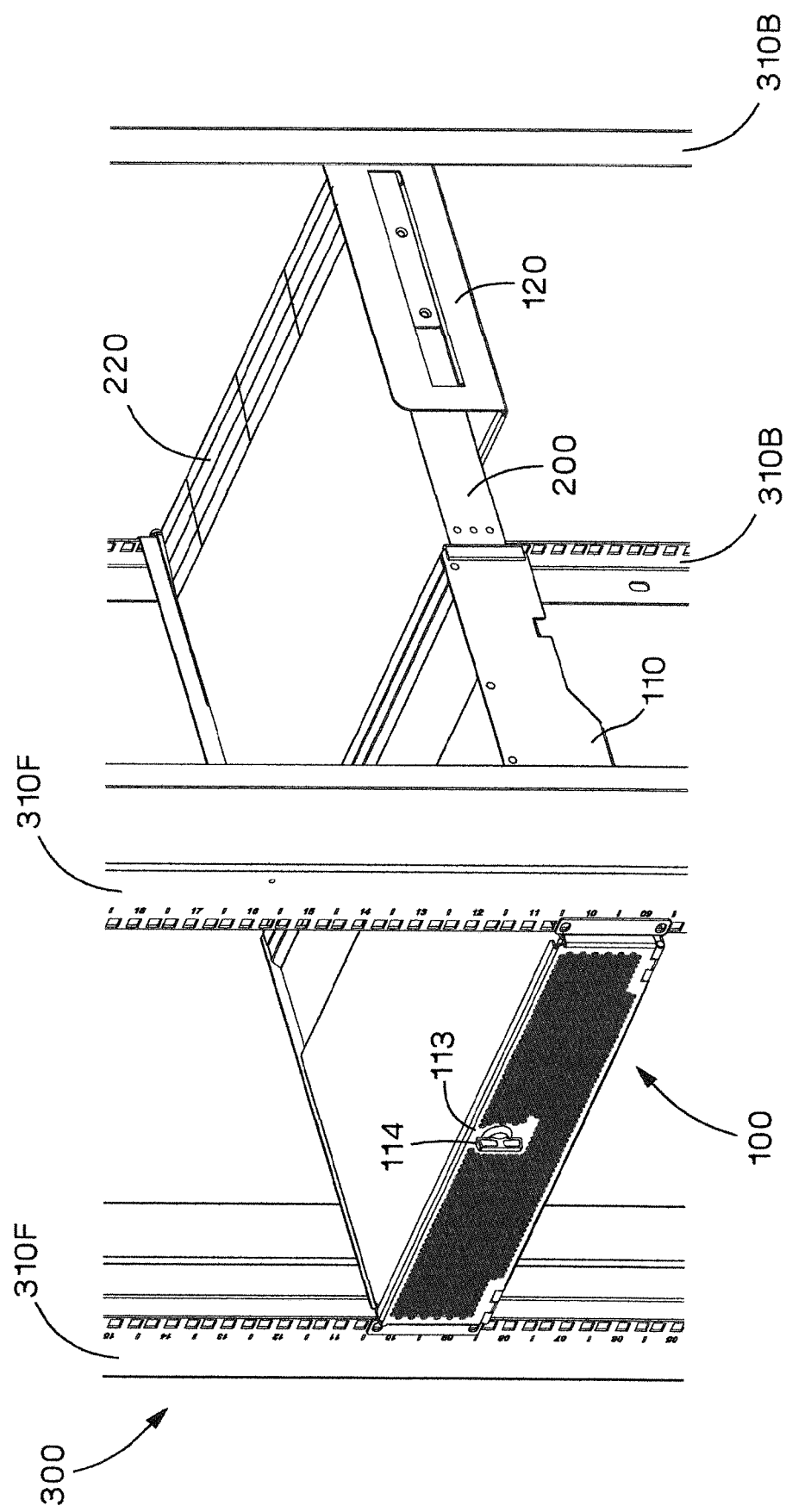
FIG. 1 is a top front perspective view of a thermal management system for a switch in a network cabinet according to an embodiment of the present invention.
Figure 2:
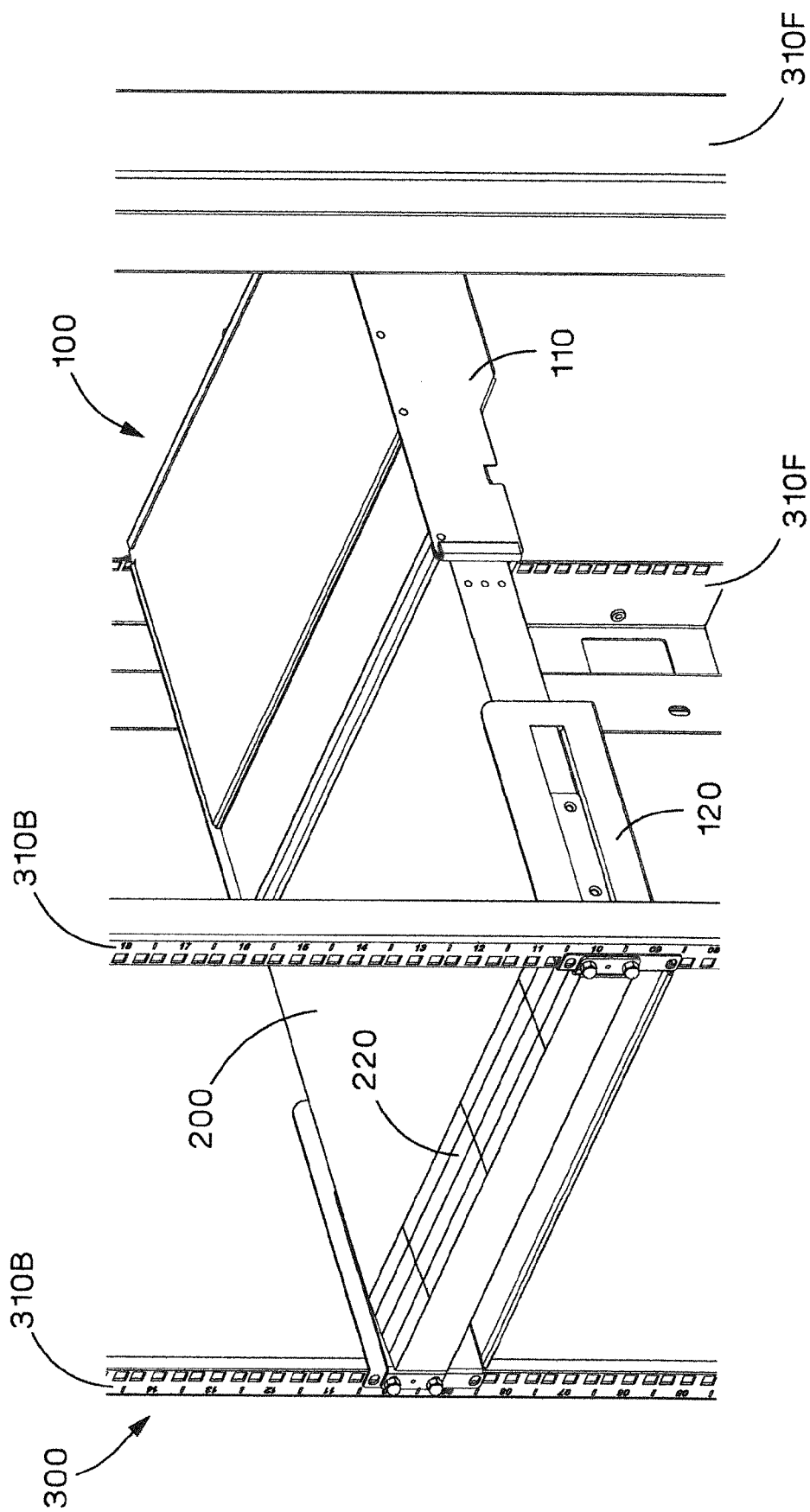
FIG. 2 is a top back perspective view of the thermal management system of FIG. 1.
Figure 3:
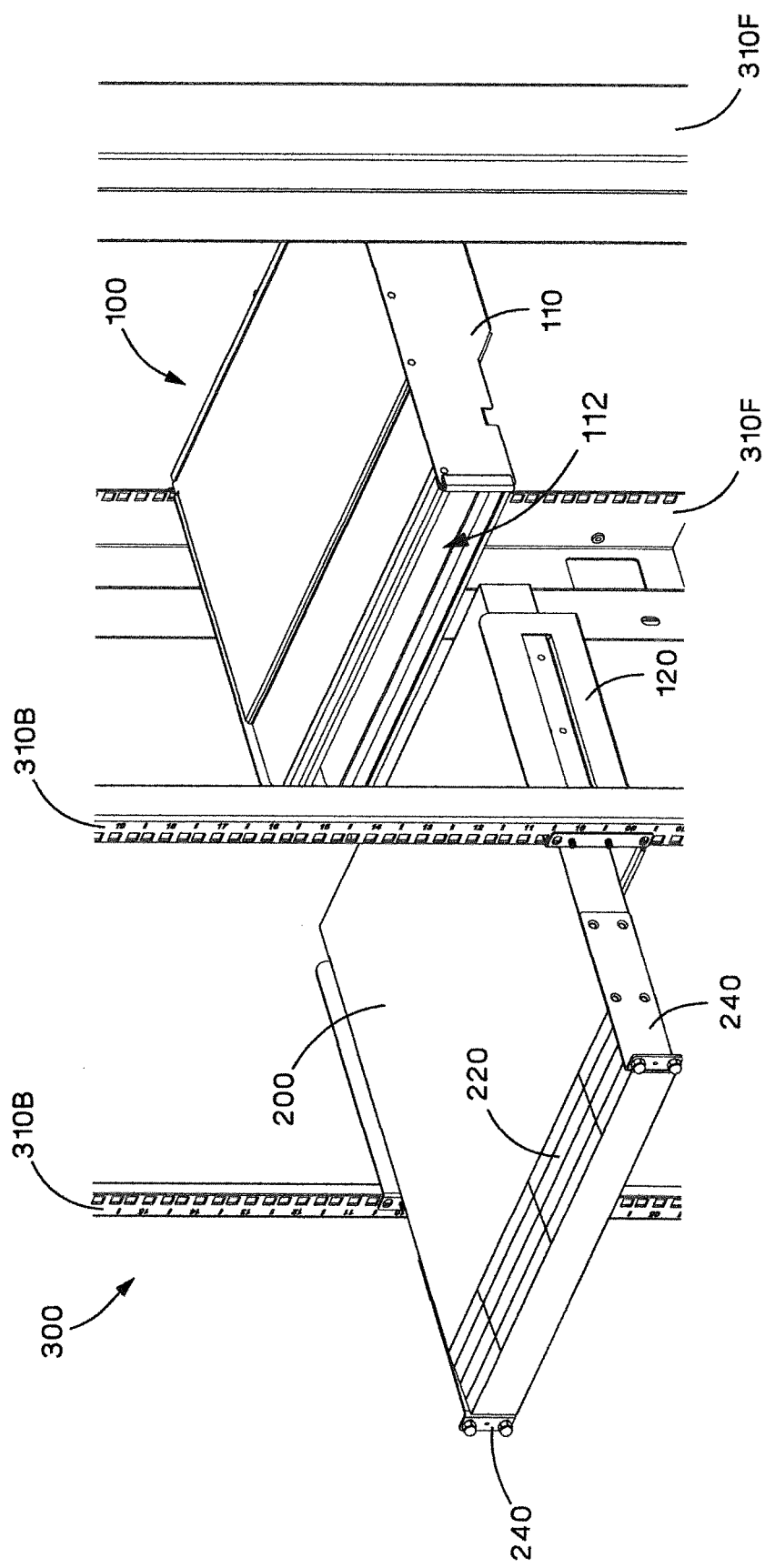
FIG. 3 is a partially exploded view of the thermal management system of FIG. 2.
Figure 4:
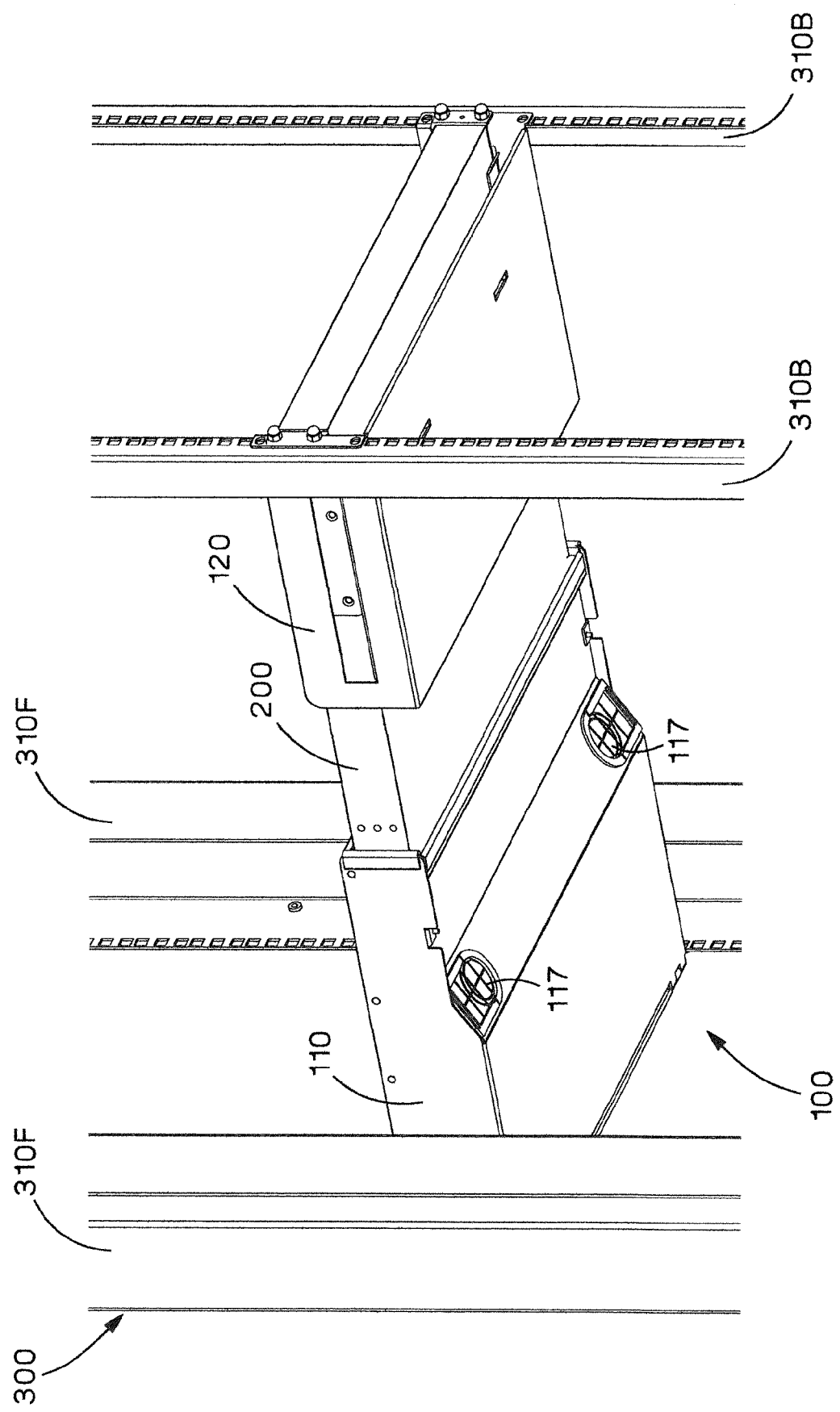
FIG. 4 is a bottom back perspective view of the thermal management system of FIG. 1.
Figure 5:
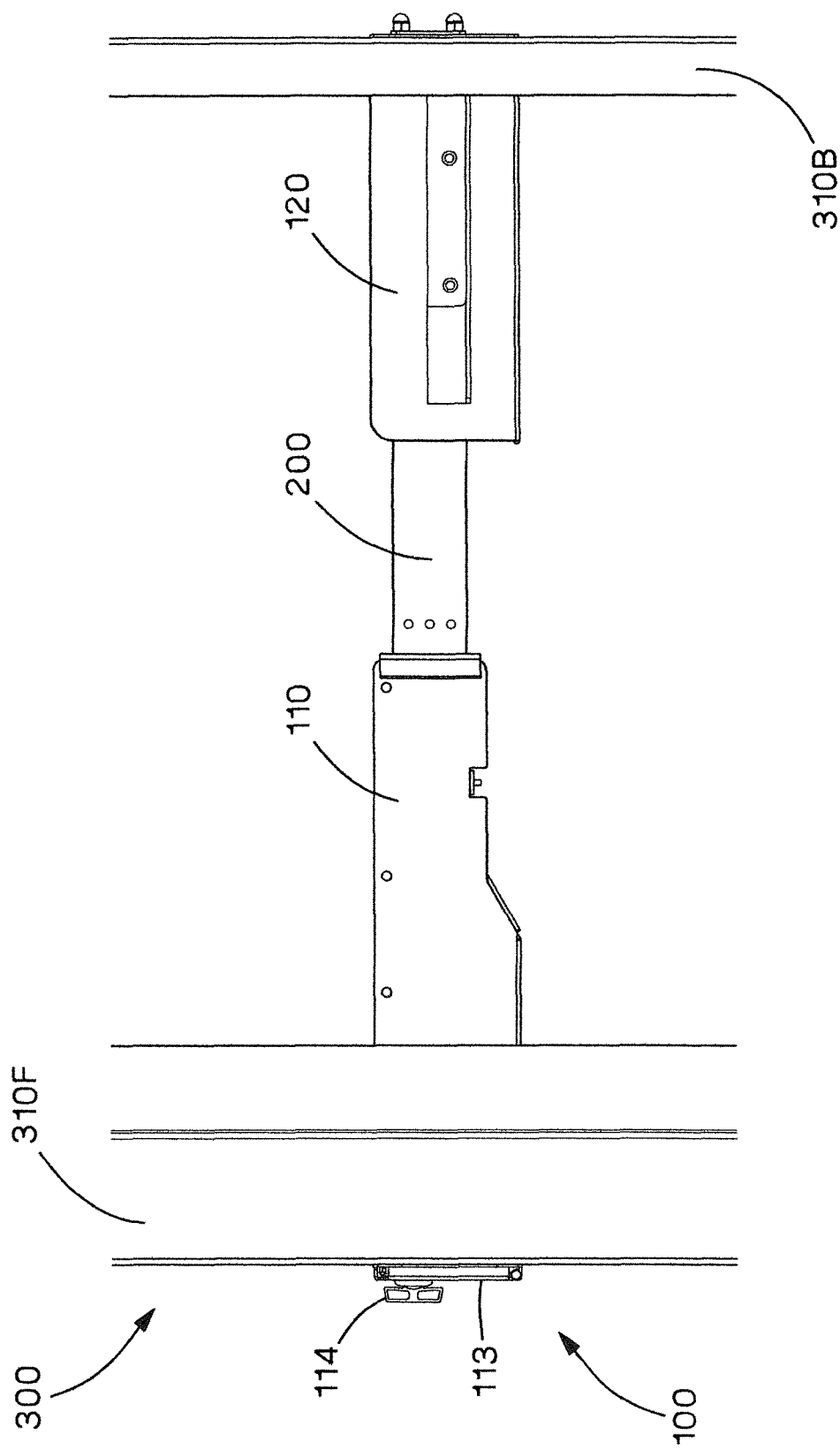
FIG. 5 is a side view of the thermal management system of FIG. 1.
Figure 6:
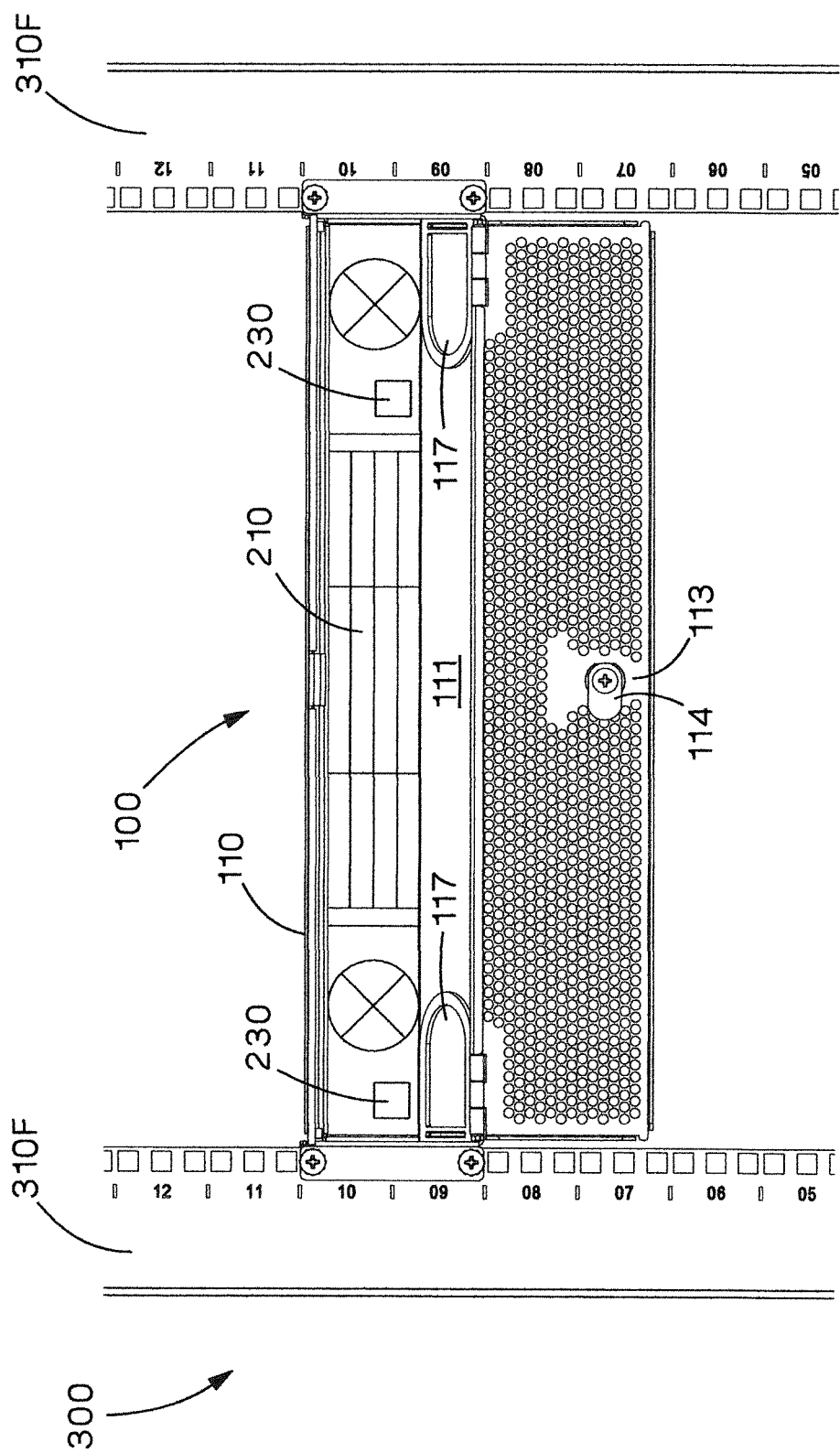
FIG. 6 is a front view of the thermal management system of FIG. 1, showing the perforated door in the open position.

As shown in FIGS. 1-7, the thermal management system 100 is mounted to the network cabinet 300 and includes a duct assembly 110 and a support bracket 120. More particularly, the duct assembly 110 is mounted to equipment rails 310F at the front of the network cabinet 300 (FIG. 1) and the support bracket 120 is mounted to equipment rails 310B at the back of the network cabinet 300 (FIG. 2). The switch 200 is mounted to the support bracket 120 (FIGS. 2-3).

Both the duct assembly 110 and the support bracket 120 support the switch 200. However, because the duct assembly 110 and the support bracket 120 are not connected to each other (FIG. 3), the thermal management system 100 accommodates a variety of equipment rail depths and switch depths. For example, the equipment rail depth is adjustable from about 24.0 inches to about 32.3 inches to accommodate a switch depth of about 20.0 inches (e.g., a Cisco Nexus 2148T Fabric Extender). As another example, the equipment rail depth is adjustable from about 24.0 to about 30.0 inches to accommodate a switch depth of about 17.7 inches (e.g., Cisco Nexus 2248TP GE Fabric Extender and Cisco Nexus 2232PP 10GE Fabric Extender).

Figure 7:
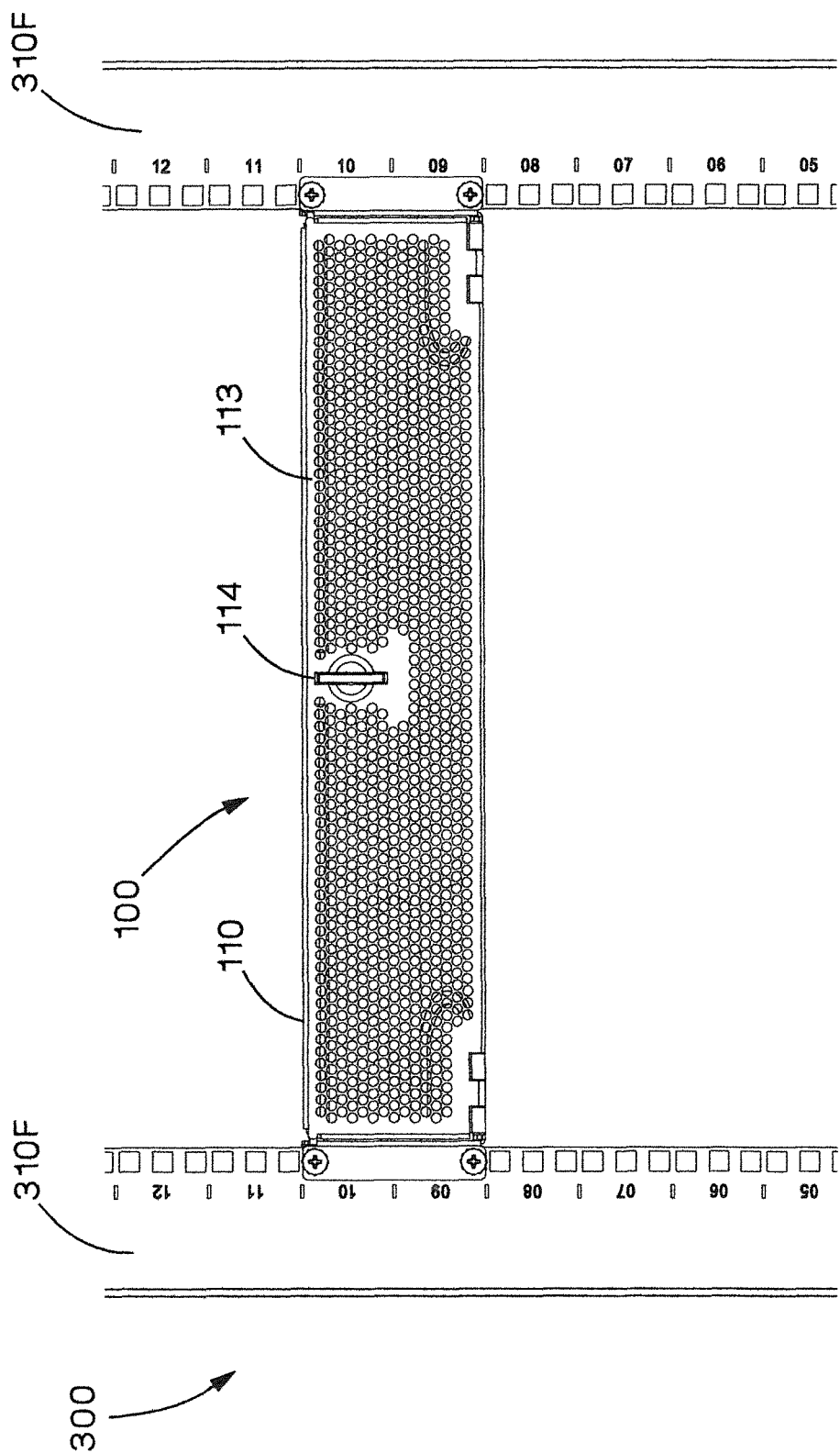
FIG. 7 is a front view of the thermal management system of FIG. 1, showing the perforated door in the closed position.
Figure 8:
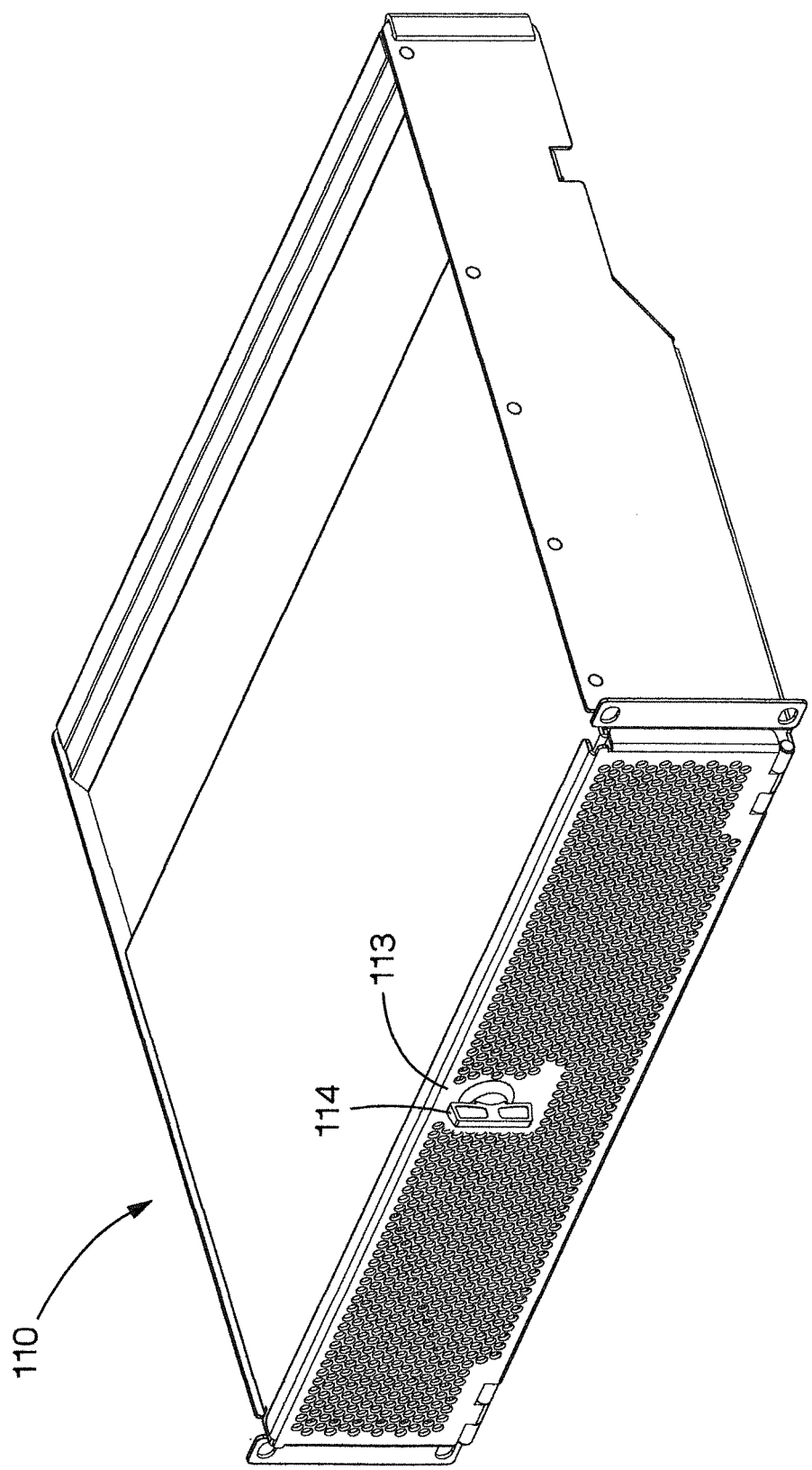
FIG. 8 is a top front perspective view of a duct assembly for the thermal management system of FIG. 1.
Figure 9:
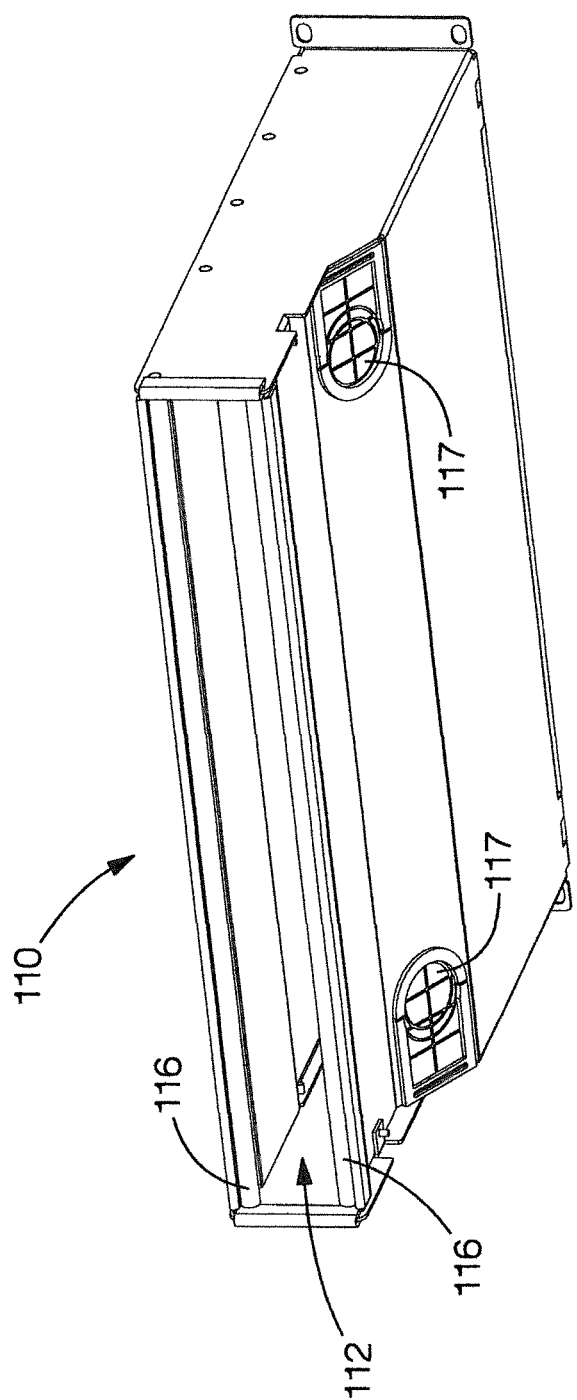
FIG. 9 is a bottom back perspective view of the duct assembly of FIG. 8.
Figure 10:
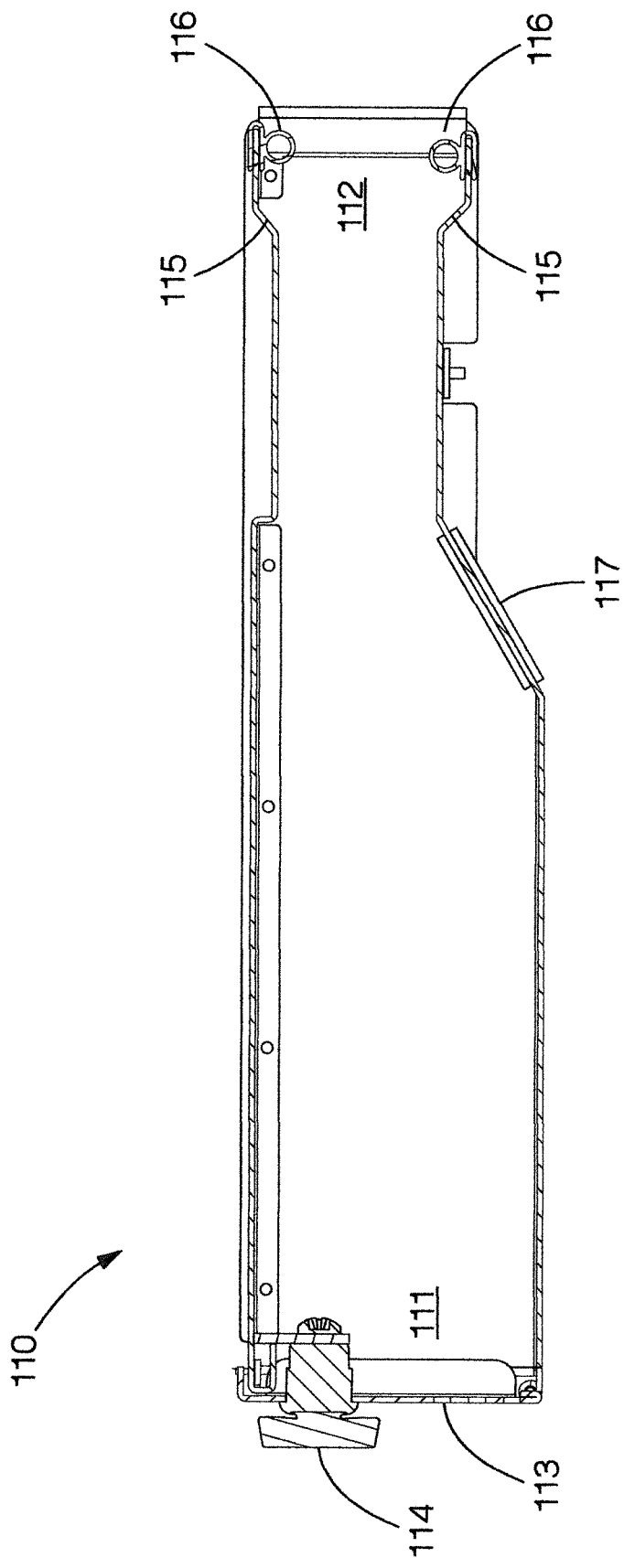
FIG. 10 is a side cross-sectional view of the duct assembly of FIG. 8.

As shown in FIGS. 8-10, the duct assembly 110 includes an opening 111 at the front of the duct assembly 110 and an opening 112 at the back of the duct assembly 110. The opening 111 at the front of the duct assembly 110 is about 2 RU (3.5 inches) to provide access to the front of the switch 200 and includes a perforated door 113 that rotates from an open position (FIG. 6) to a closed position (FIG. 7). The perforated door 113 includes a latch 114 to secure the perforated door 113 in the closed position. In the open position, the perforated door 113 permits access to components on the front of the switch 200, such as power supplies, fan modules, status indicators, etc. In the closed position, the perforated door 113 restricts access to the front of the switch 200, but permits cold air from the front of the network cabinet 300 to flow through the perforated door 113 and into the duct assembly 110 and the switch 200.

The opening 112 at the back of the duct assembly 110 is about 1 RU (1.75 inches) to accommodate the switch 200, which is also about 1 RU (1.75 inches), and includes guide surfaces 115, such as guide ramps (FIG. 10), to guide the switch 200 into the duct assembly 110 and sealing members 116 to seal any gap between the switch 200 and the duct assembly 110.

Additionally, the duct assembly 110 includes cable pass-throughs 117 to route cables (not shown), such as power cords connected to power receptacles 230 on the front of the switch 200 (FIGS. 6 and 13), from the front of the switch 200 into the network cabinet 300.

Figure 11:
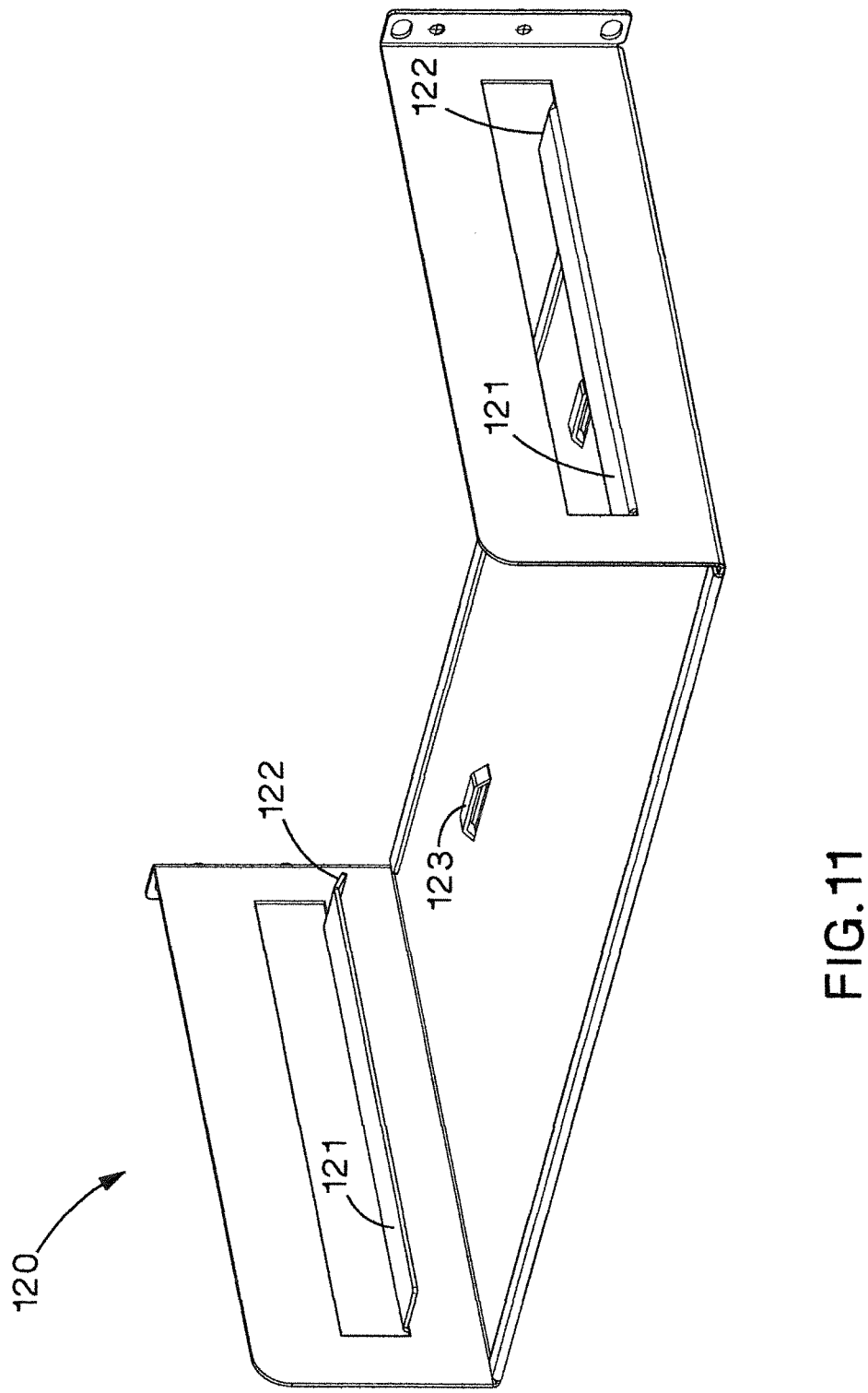
FIG. 11 is a top front perspective view of a support bracket for the thermal management system of FIG. 1.
Figure 12:
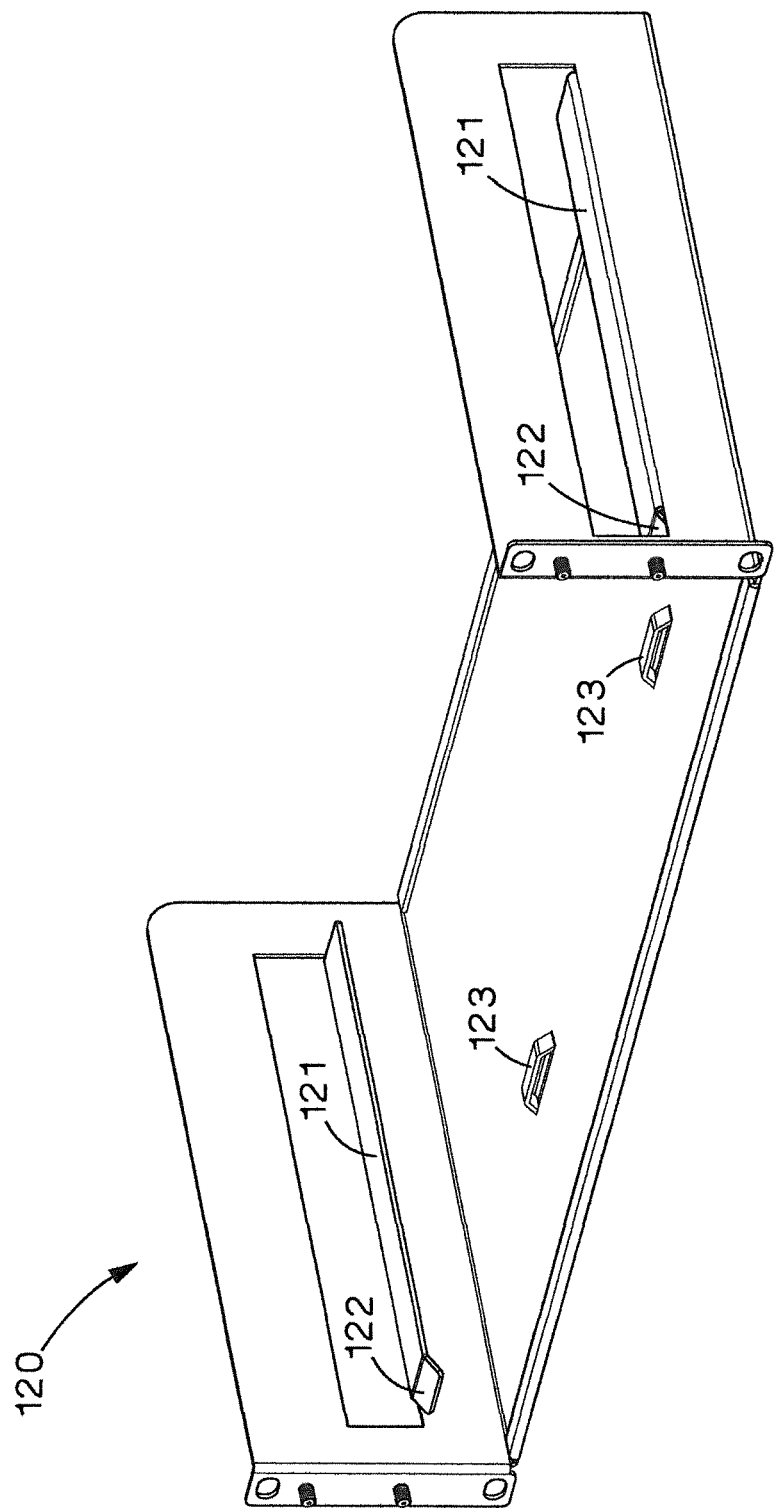
FIG. 12 is a top back perspective view of the support bracket of FIG. 11.

As best seen in FIGS. 11-12, the support bracket 120 includes flanges 121 to support the switch 200 and guide the switch 200 into the duct assembly 110. The flanges 121 include guide surfaces 122, such as guide ramps (FIGS. 11-12), to guide the switch 200 into the support bracket 120.

Additionally, the support bracket 120 includes cable tie-downs 123 to secure cables (not shown), such as power cords connected to power receptacles 230 on the front of the switch 200 (FIGS. 6 and 13), to the support bracket 120, for example, using fasteners (not shown), such as cable ties.

Figure 13:
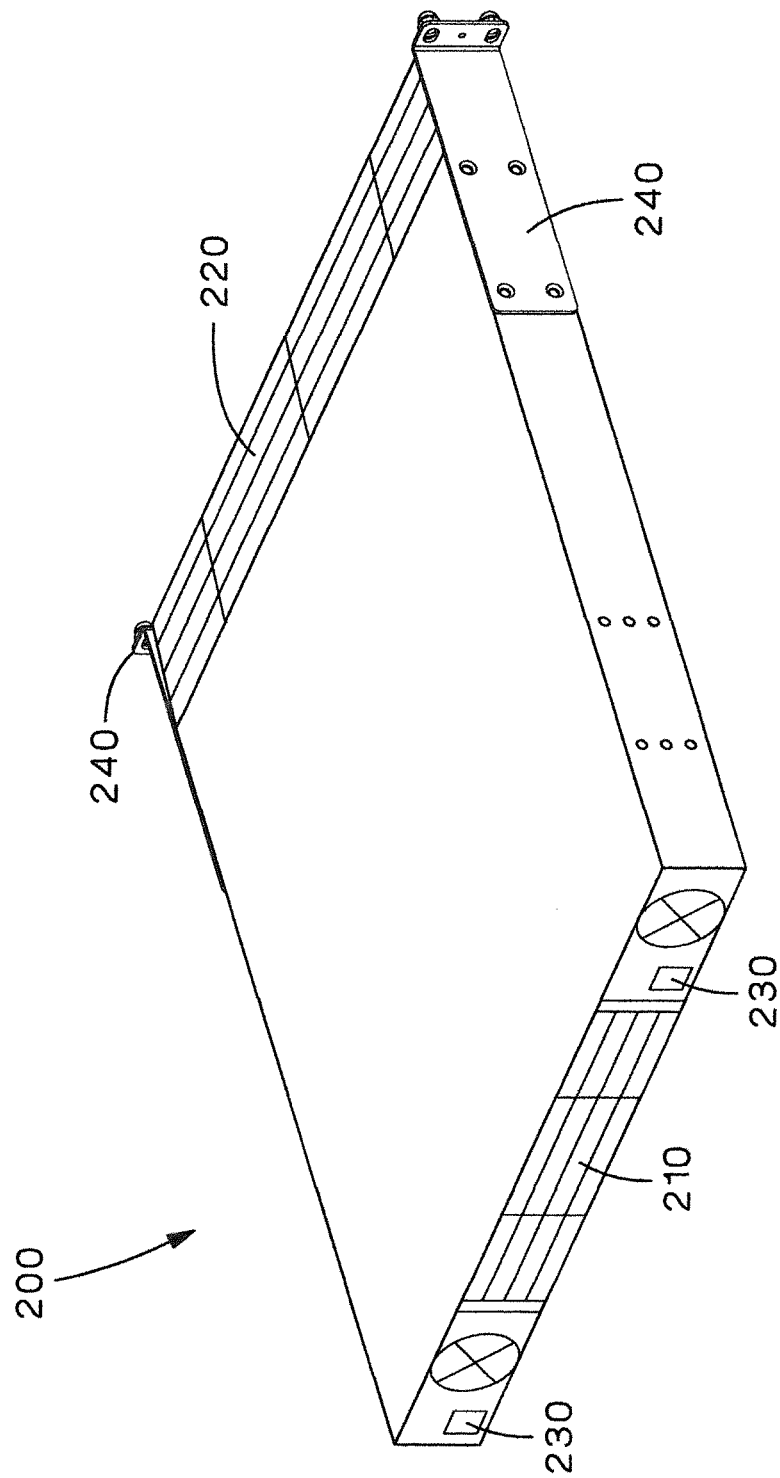
FIG. 13 is a top front perspective view of a switch for the thermal management system of FIG. 1.
Figure 14:
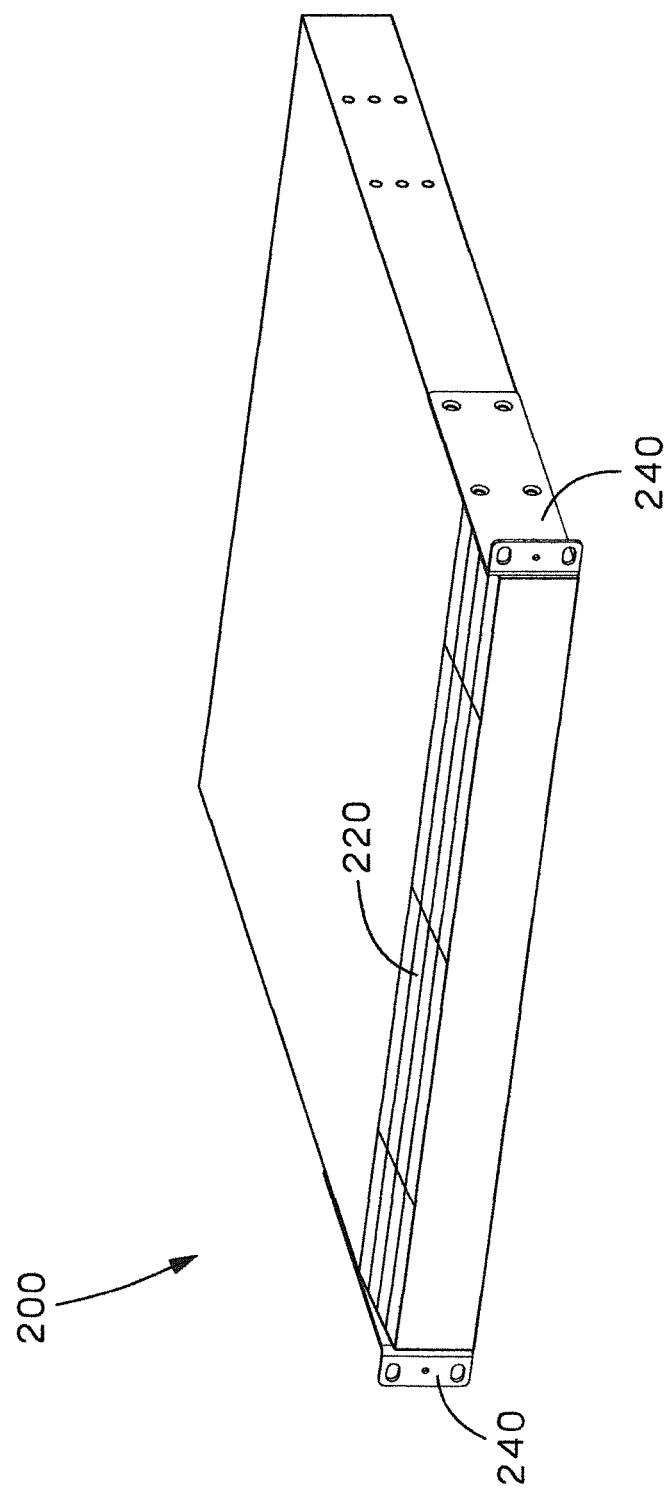
FIG. 14 is a top back perspective view of the switch of FIG. 13.

As best seen in FIGS. 13-14, the switch 200 includes an air intake opening 210 at the front of the switch 200 and an air exhaust opening 220 at the back of the switch 200. Cold air enters the air intake opening 210 from the front of the network cabinet 300 and hot air exits the hot air exhaust opening 220 to the back of the network cabinet 300. The thermal management system 100, and more particularly, the duct assembly 110, separates the hot air in the back of the network cabinet 300 from the cold air in the front of the network cabinet 300. Additional components (not shown), such as additional electronic equipment (e.g., servers, switches, etc.) and filler panels, also separate the hot air in the back of the network cabinet 300 from the cold air in the front of the network cabinet 300.

Additionally, the switch 200 includes mounting brackets 240 to mount the switch 200 to the support bracket 120.

While the thermal management system 100 is described with respect to a 1-RU switch, it is likewise contemplated that the thermal management system 100 accommodate multiple switches and multiple-RU switches, as well as other types of electronic equipment, such as servers.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. A system for managing heat generated by electronic equipment in an electronic equipment enclosure, the system comprising a duct adapted to receive a first portion of the electronic equipment, the first portion of the electronic equipment comprising an air intake opening, wherein the duct forms a barrier between the first portion of the electronic equipment and a second portion of the electronic equipment, the second portion of the electronic equipment comprising an air exhaust opening, wherein the barrier separates cooled air entering the air intake opening and heated air exiting the air exhaust opening.

2. The system of claim 1, wherein the electronic equipment includes a switch.

3. The system of claim 2, wherein the switch includes a fabric extender.

4. The system of claim 1, wherein the duct includes a first opening for receiving the first portion of the electronic equipment.

5. The system of claim 4, wherein the duct includes a guide ramp adjacent the first opening for guiding the first portion of the electronic equipment into the duct.

6. The system of claim 4, wherein the duct includes a seal adjacent the first opening for sealing a gap between the duct and the first portion of the electronic equipment.

7. The system of claim 4, wherein the duct includes a second opening opposite the first opening for accessing the first portion of the electronic equipment.

8. The system of claim 7, wherein the height of the first opening is substantially equal to the height of the electronic equipment.

9. The system of claim 7, wherein the height of the second opening is greater than the height of the first opening.

10. The system of claim 7, further comprising a door rotatably connected to the duct adjacent the second opening.

11. The system of claim 10, wherein the door rotates from an open position to a closed position, the door permitting access to the first portion of the electronic equipment in the open position and restricting access to the first portion of the electronic equipment in the closed position.

12. The system of claim 11, wherein the door includes a latch for securing the door in the closed position.

13. The system of claim 11, wherein the door is perforated so as to permit airflow through the door when the door is in the closed position.

14. The system of claim 1, wherein the duct includes a cable pass-through for routing cables from the first portion of the electronic equipment to the second portion of the electronic equipment.

* * * * *